United States Patent
Roehr et al.

(10) Patent No.: US 7,184,317 B2
(45) Date of Patent: Feb. 27, 2007

(54) METHOD FOR PROGRAMMING MULTI-BIT CHARGE-TRAPPING MEMORY CELL ARRAYS

(75) Inventors: Thomas Roehr, Aschheim (DE); Josef Willer, Riemerling (DE)

(73) Assignee: Infineon Technologies AG, Munich (DE)

( * ) Notice: Subject to any disclaimer, the term of this patent is extended or adjusted under 35 U.S.C. 154(b) by 63 days.

(21) Appl. No.: 11/172,421

(22) Filed: Jun. 30, 2005

(65) Prior Publication Data

US 2007/0002645 A1    Jan. 4, 2007

(51) Int. Cl.
*G11C 11/34*    (2006.01)
(52) U.S. Cl. .......................... 365/185.28; 365/185.18; 365/185.03; 365/185.13
(58) Field of Classification Search ........... 365/185.28, 365/185.03, 185.18, 185.13
See application file for complete search history.

(56) References Cited

U.S. PATENT DOCUMENTS 5,768,192 A    6/1998  Eitan
6,011,725 A    1/2000  Eitan
6,282,145 B1*  8/2001  Tran et al. ............. 365/230.06
6,525,969 B1*  2/2003  Kurihara et al. ....... 365/185.25
2003/0185051 A1  10/2003  Yeh et al.
2004/0076038 A1  4/2004  Ohtani et al.
2005/0104117 A1  5/2005  Mikolajick et al.

OTHER PUBLICATIONS

Yeh, C.C., et al., "PHINES: A Novel Low Power Program/Erase, Small Pitch, 2-Bit per Cell Flash Memory," 2002 IEEE, 4 pages.
Willer, J., et al., "110nm NROM Technology for Code and Data Flash Products," 2004 IEEE, Symposium on VLSI Technology Digest of Technical Papers, pp. 76-77.

* cited by examiner

*Primary Examiner*—Tuan T. Nguyen
(74) *Attorney, Agent, or Firm*—Slater & Matsil, L.L.P.

(57) ABSTRACT

A programming voltage is applied to source and drain in order to generate hot-hole injection at one end of the channel of a memory cell. The undesired programming of a neighboring memory cell is avoided by the application of an intermediate inhibit voltage to an adjacent bitline. This is done by precharging all the bitlines to the inhibit voltage, either by successively applying the inhibit voltage to every bitline individually or by applying both the upper and the lower programming voltage to one half of the bitlines and then short-circuiting all the bitlines to produce an intermediate voltage.

20 Claims, 4 Drawing Sheets

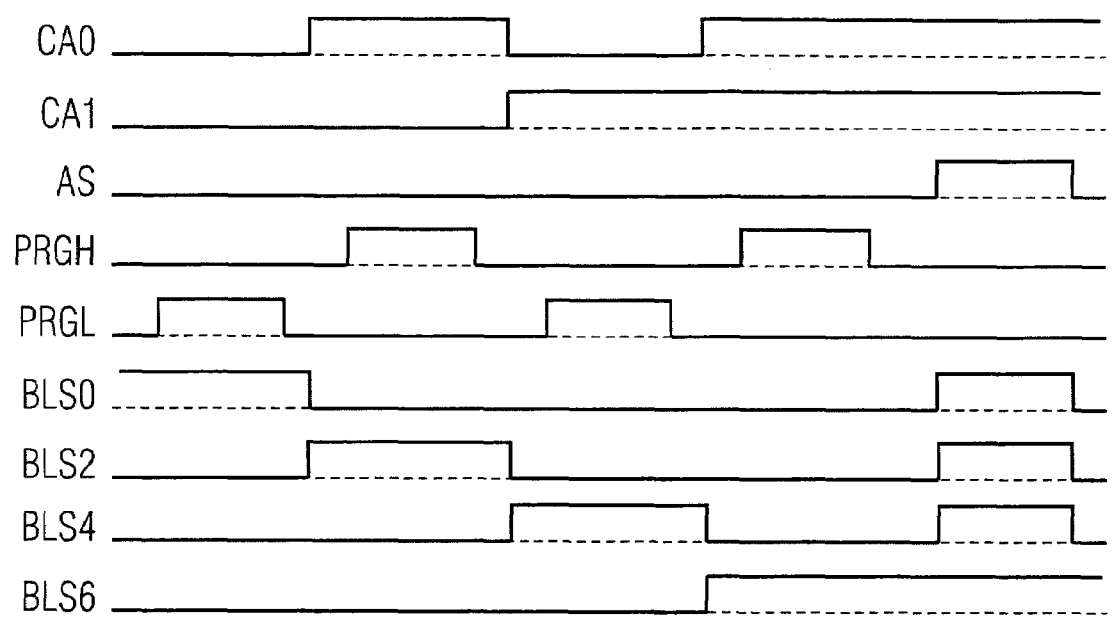

METHOD FOR PROGRAMMING MULTI-BIT CHARGE-TRAPPING MEMORY CELL ARRAYS

TECHNICAL FIELD

This invention concerns a method for programming memory cell arrays of multi-bit charge-trapping memory cells, which are programmed by the injection of hot holes at either end of the channel region.

BACKGROUND

Memory devices with charge-trapping layers, especially SONOS memory cells comprising oxide-nitride-oxide layer sequences as storage medium, are usually programmed by channel hot electron injection. U.S. Pat. No. 5,768,192 and U.S. Pat. No. 6,011,725, which are both incorporated herein by reference, disclose charge-trapping memory cells of a special type of so-called NROM cells, which can be used to store bits of information both at the source and at the drain below the respective gate edges. The programmed cell is read in reverse mode to achieve a sufficient two-bit separation. Erasure is performed by hot-hole injection. The current consumption of each cell during programming with fully driven transistor is about 100 µA. An increment of charges towards the middle channel region significantly reduces the number of possible programming cycles. Therefore, it is not possible to shrink the cell to the sub-100-nm technology since the increasing amount of charges in the middle channel region cannot be completely neutralized during the reprogramming process. Thus, the performance of the memory cell will deteriorate with an increasing number of programming cycles.

U.S. Patent Application Publication No. 2003/0185055 A1 and a corresponding paper of C. C. Yeh et al., "PHINES: A Novel Low Power Program/Erase, Small Pitch, 2-Bit per Cell Flash Memory", 2002 IEEE, both of which are incorporated herein by reference, disclose a non-volatile semiconductor memory cell with electron-trapping erase state, which is operated as flash memory and is able to store two bits. The erasure takes place by Fowler-Nordheim tunneling of electrons from either channel or gate electrode into the storage layer of a conventional charge-trapping layer sequence, for example an ONO layer sequence. In programming this memory, electric holes are injected into the non-conducting charge-trapping layer. Hot hole injection can be induced at source and drain, which means, at both ends of the channel. This operating method avoids high programming currents.

In a virtual-ground array of memory cells that are addressed by wordlines and bitlines, the programming of an individual cell by hot-hole injection is performed by the application of a lower and a higher programming voltage to the two bitlines that are connected to the source/drain regions of the memory cell that is to be programmed. The location of the programmed bit at either end of the channel region in the vicinity of one of the source/drain regions is selected by the direction of the applied source/drain voltage. A negative voltage, typically about −7 V, is applied to the gate electrode of the cell transistor to be programmed. As the wordlines connect all the gate electrodes along a row of memory cells, this negative voltage is also present at the gate electrodes of the neighboring cell transistors of the same row in which the cell transistor that is to be programmed is situated. All the other gate electrodes within the array are on 0 V ("ground"). The programming voltages are typically, for example, 0 V and +4 V.

By the application of this potential difference at the source/drain regions of the memory cell to be programmed, an injection of hot holes is generated at drain, which is connected to the high programming voltage of 4 V. If the source/drain region at the other end of the adjacent memory cell in the same row of memory cells is on 0 V, the source/drain voltage of the adjacent memory cell transistor is also sufficient for a programming of this transistor, which is not desired. Therefore, a so-called inhibit voltage is applied to this neighboring source/drain region, which may be typically, for example, +2 V, in order to reduce the source/drain voltage of that transistor to a value that is sufficiently low to guarantee that no programming occurs in the neighboring memory cell. This is possible because the programming requires a minimal value of the source/drain voltage, on which the efficiency of the injection mechanism strongly depends. All the other bitlines can be on 0 V so that the source/drain voltages of all the memory transistors that are not to be programmed are typically 0 V or 2 V, and these memory cells are not programmed. The programming procedure starts with the application of the inhibit voltage to the neighboring bitline, and then the programming voltage is applied to the bitlines that are connected to the memory cell that is to be programmed. The exact value of the voltages of the other bitlines is not important for the programming process so that the voltages of those bitlines may vary within certain limits. However, it is necessary that the programming voltage is applied to only one of the memory cells of the row of memory cells that are addressed by the same wordline.

Memory products with a virtual-ground architecture usually comprise master bitlines that are connected to groups of bitlines via especially arranged select transistors. The bitlines that succeed each other along the rows are alternatingly connected to different master bitlines so that the different programming voltages can be applied to adjacent bitlines via the selection transistors. In a typical arrangement of the array, the groups of bitlines that are connected to the same master bitline comprise, for example, four or eight bitlines each. A multiplexer circuit is arranged to switch the select transistors so that no more than one bitline can be connected simultaneously to one of the master bitlines. The sequential application of the inhibit voltage the programming voltages to different bitlines requires a significantly more complicated switching circuitry. This is a drawback of this memory architecture comprising charge-trapping memory cells that are programmed by hot-hole injection.

SUMMARY OF THE INVENTION

In one aspect, this invention provides a method for programming multi-bit charge-trapping memory cell arrays by hot-hole injection that is suitable for a virtual-ground architecture that can be performed basically with a usual addressing circuitry.

In a further aspect, this method circumvents the provision of an additional inhibit voltage source.

This method for programming multi-bit, charge-trapping memory cell arrays comprises a step that is performed by switching the select transistors in the bitlines consecutively and further select transistors in the master bitlines so that an appropriate inhibit voltage is successively applied at least to every bitline that does not connect the source/drain regions of the memory cell that is to be programmed and applying the lower and upper programming voltages to the bitlines that are connected to the source/drain regions of the memory cell to be programmed.

In a variant of this method, a programming step is performed by switching the select transistors and further select transistors so that the lower and upper programming voltages are each applied to selected pluralities of the bitlines, switching the select transistors to connect a plurality of the bitlines simultaneously and then applying the lower and upper programming voltage to the bitlines that are connected to the source/drain regions of the memory cells to be programmed. In this manner, before the actual programming step, a short-circuit of the bitlines is effected, by which the precharged levels are mixed so that an intermediate voltage results, which is adapted to lie within the range that is appropriate for the inhibit voltage.

These and other features and advantages of the invention will become apparent from the following brief description of the drawings, detailed description and appended claims and drawings.

BRIEF DESCRIPTION OF THE DRAWINGS

For a more complete understanding of the present invention, and the advantages thereof, reference is now made to the following descriptions taken in conjunction with the accompanying drawings, in which:

FIG. 6 shows a diagram of switching signals for the embodiments of FIGS. 4 and 5.

The following list of reference symbols can be used in conjunction with the figures:

| AS | additional signal | VIN | inhibit voltage |
|---|---|---|---|
| BLn | bitline | VPRGH | higher programming voltage |
| BLSn | select transistor | VPRGL | lower programming voltage |
| CA0 | first signal | WLn | wordline |
| CA1 | second signal | | |

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
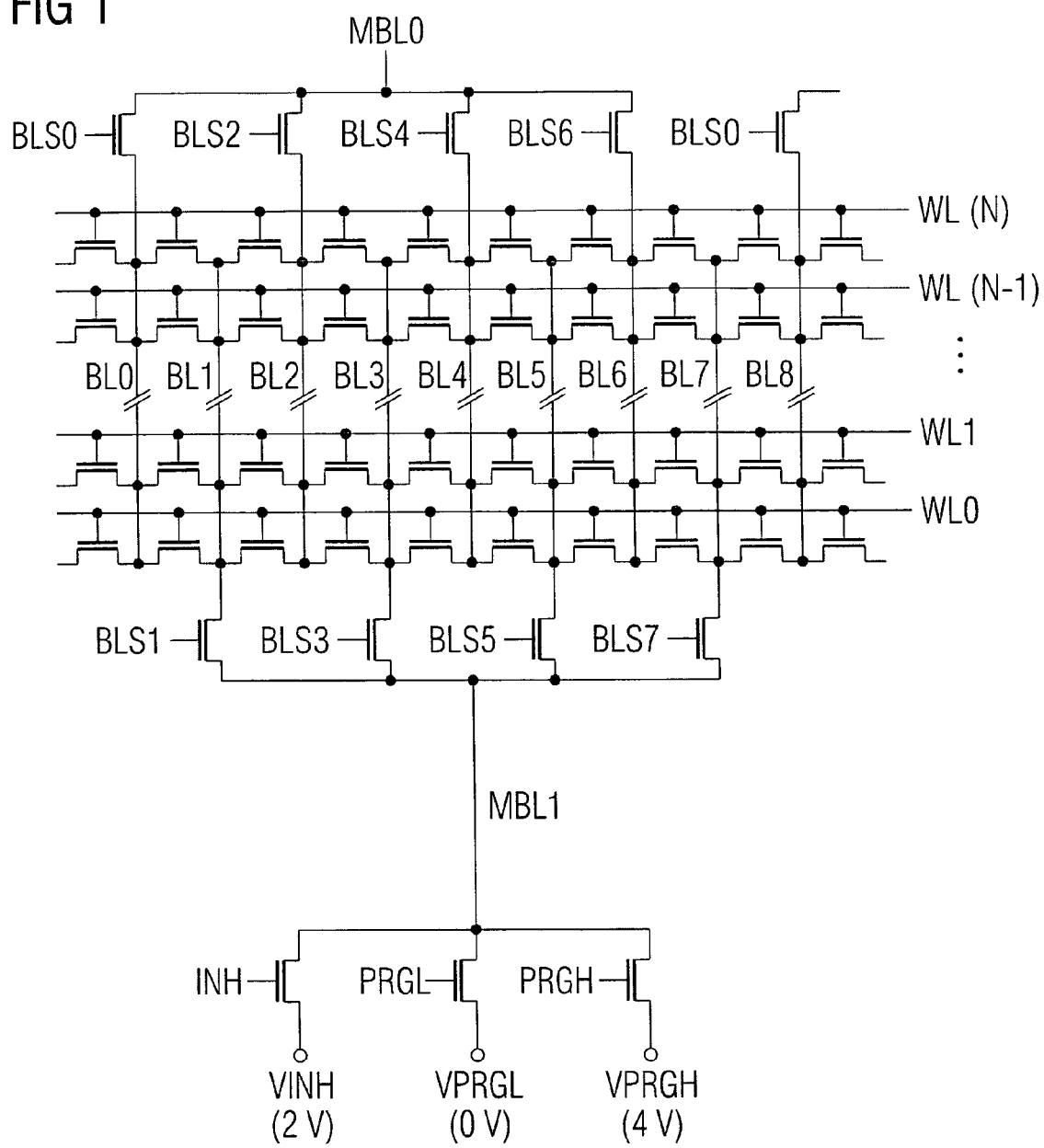
FIG. 1 shows a circuit diagram of a section of the memory cell array including bitlines and master bitlines.

FIG. 1 shows a circuit diagram of a charge-trapping memory cell array in virtual-ground architecture. The operating method to be described is especially adapted to the programming by means of hot-hole injection. The memory cells are arranged in rows and columns, and the channels are connected in series along the rows. Source/drain regions that are common to two adjacent memory cells are connected along the columns to the same bitline. The gate electrodes are connected to the wordlines along the rows. The diagram shows wordlines numbered from WL0 to WL(N). The section shows two complete groups of bitlines, one comprising bitlines BL0, BL2, BL4, and BL6, which are connected to the master bitline MBL0 via select transistors BLS0, BLS2, BLS4, and BLS6. The other section comprises bitlines BL1, BL3, BL5, and BL7, which are connected to the master bitline MBL1 via select transistors BLS1, BLS3, BLS5, and BLS7. The next bitline BL8 and the appertaining select transistor BLS0 on the right-hand side of FIG. 1 show that this arrangement is a periodical repetition of the represented sections and the subdivision of the bitlines into groups that are alternatingly connected to the master bitlines.

At the bottom of FIG. 1, the voltage sources are inserted in a diagrammatic fashion. Further select transistors INH (inhibit), PRGL (program low), and PRGH (program high) are provided so that the inhibit voltage VINH (in this example 2 V), the lower programming voltage VPRGL (in this example 0 V), and the upper programming voltage VPRGH (in this example 4 V) can be applied to either of the bitlines BL1, BL3, BL5, and BL7 of this group. Corresponding further select transistors are also arranged in the other master bitline MBL0 but are not shown in the diagram. The switching circuitry can be a conventional multiplexer circuit, by which the select transistors are alternatingly switched conducting so that always only one bitline is coupled to the relevant master bitline during the programming process.

The programming process starts with the application of an inhibit voltage to every bitline that belongs at least to the two groups of bitlines, which encompass the bitlines that couple the memory cell that is to be programmed. The inhibit voltage may also be applied to the bitlines of the neighboring groups of bitlines or even to every bitline within the memory cell array. One feature of this first variant of the inventive method is that the application of the inhibit voltage is not confined to the location of the memory cell that is to be programmed. Therefore, it is not necessary to select the bitline that is adjacent to the bitline that couples the source/drain region at the position of the bit that is to be programmed, in order to apply the inhibit voltage exclusively to the selected bitline. Instead, a plurality of bitlines is precharged to the inhibit voltage so that only the bitlines connecting the memory cell to be programmed have then to be selected. This takes place subsequently by a procedure that is in principle identical to the usual addressing of the memory cells during the programming of virtual-ground cell arrays.

In connection with this operating mode, the applied programming voltages are chosen to generate a hot-hole injection into the charge-trapping layer in the vicinity of the drain. The direction of the applied programming voltage can be chosen according to the position of the bit that has to be programmed, without any restriction with regard to the presence of the inhibit voltage, since all the neighboring bitlines have already been set to the inhibit voltage. Thus, this method of operating the memory cell array requires no additional switching circuitry apart from the facility to apply the inhibit voltage via a further select transistor in subsequent steps to the plurality of bitlines, which may or may not include the two bitlines leading to the memory cell that has to be programmed.

Figure 2:
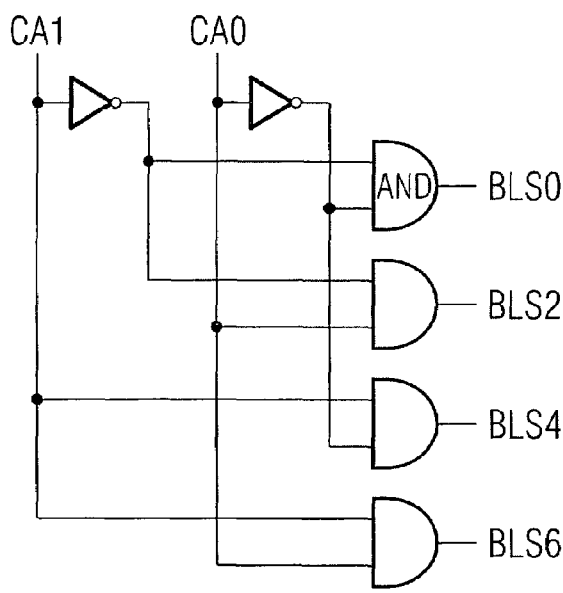
FIG. 2 shows a circuit diagram of a switching circuit that can be applied in the inventive method.

FIG. 2 shows a diagram of a switching circuit by which the bitlines BL0, BL2, BL4, and BL6 can alternatingly be connected to the common master bitline MBL0 via select transistors BLS0, BLS2, BLS4, and BLS6, respectively. The diagram shown in FIG. 2 is only one example for a switching circuit that is appropriate to this purpose. Each select transistor is provided with an AND unit having two inputs, which are connected to the source of a first signal CA0 and the source of a second signal CA1 either directly or via an inverter. It is immediately clear from the diagram of FIG. 2 that the four possible combinations of the signals on the two signal lines render four different combinations of the output signals that are applied to the gate electrodes of the select transistors to switch exactly one of them conducting in each case. Thus, this arrangement enables the bitlines to be precharged to the inhibit voltage so that the programming can be performed without running the risk that a further bit is programmed in a wrong storage site.

Figure 3:
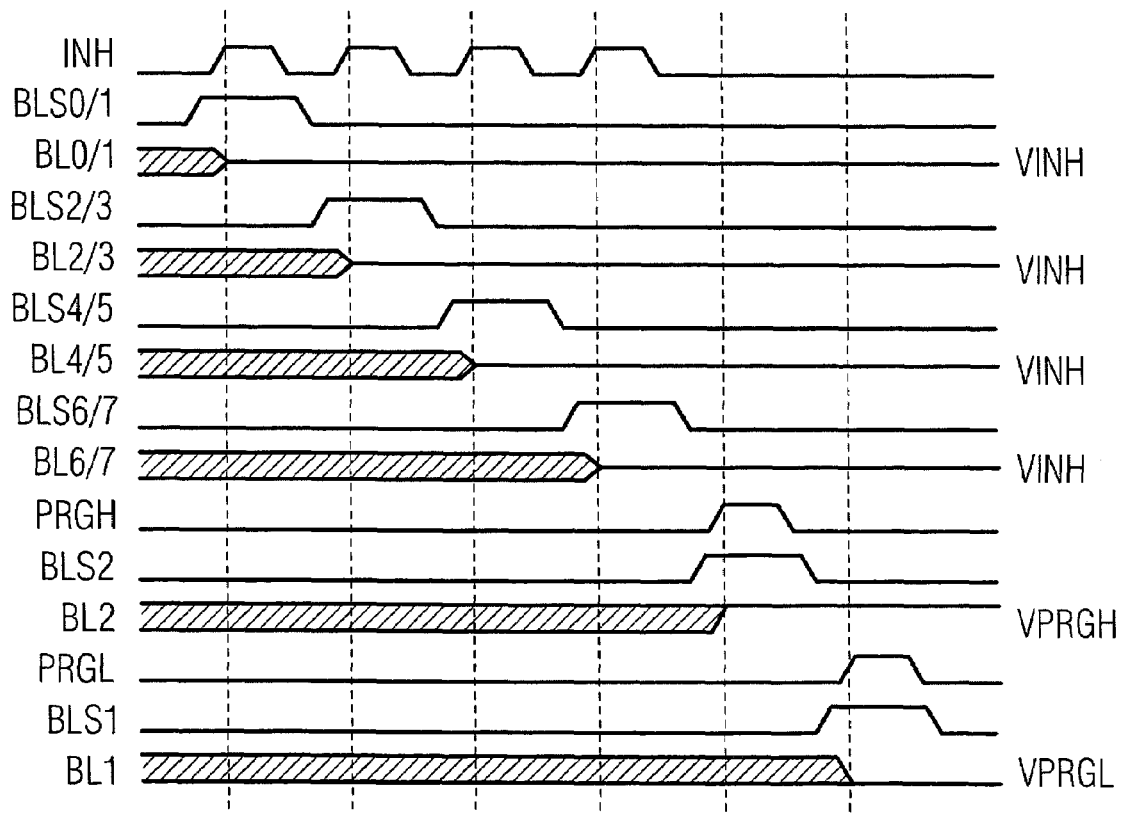
FIG. 3 shows a diagram of the voltages that are applied to the connections during the programming process.

FIG. 3 shows a diagram of the temporal sequence of the voltages that are applied to the various inputs. The diagram is divided into time intervals by the vertical broken lines. The first horizontal line shows the periodic application of the inhibit voltage to the select transistors BLS0, BLS2, BLS4, and BLS6 or to their counterparts belonging to the master bitline MBL1, one after another. The previously undefined voltage on the corresponding bitlines is indicated by the hatchings. After the precharging step, the higher programming voltage VPRGH and the lower programming voltage VPRGL are applied to the bitlines, in this example BL1 and BL2, which connect the source/drain regions of the memory cell that is to be programmed. The two hatched areas at the bottom of the diagram of FIG. 3 indicate that the voltage on bitlines BL1 and BL2 may have been left undefined in the precharging step, because these bitlines need not be set to the inhibit voltage.

Figure 4:
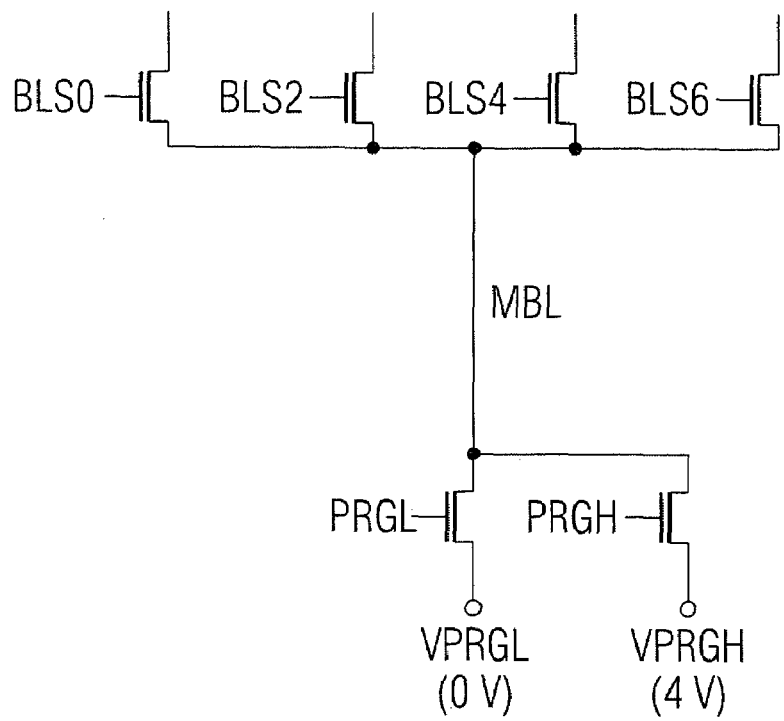
FIG. 4 shows a section of the circuit diagram according to FIG. 1 for an alternative variant of the method.

FIG. 4 shows the electric connection for another variant of this method, which does not need a separate voltage source to provide the inhibit voltage. The section of the circuit that is shown in FIG. 4 corresponds to the lower part of the circuit diagram of FIG. 1, with the only difference being that the inhibit voltage source is left out. Instead of charging all the bitlines with the inhibit voltage, the bitlines are partly charged to the lower and partly to the higher programming voltage. This can be done, for instance, alternatingly so that the bitlines are connected subsequently, in their physical order, to one of the two programming voltages. This means that afterwards half of the bitlines are on the lower and the other half on the higher programming voltage. Then, all the select transistors are simultaneously switched conducting so that the bitlines are short-circuited. This results in an equalization of the different voltages, rendering an intermediate voltage at about the level of the inhibit voltage. This produces the same effect as a separate and individual precharging of the bitlines by an application of an especially provided inhibit voltage.

Figure 5:
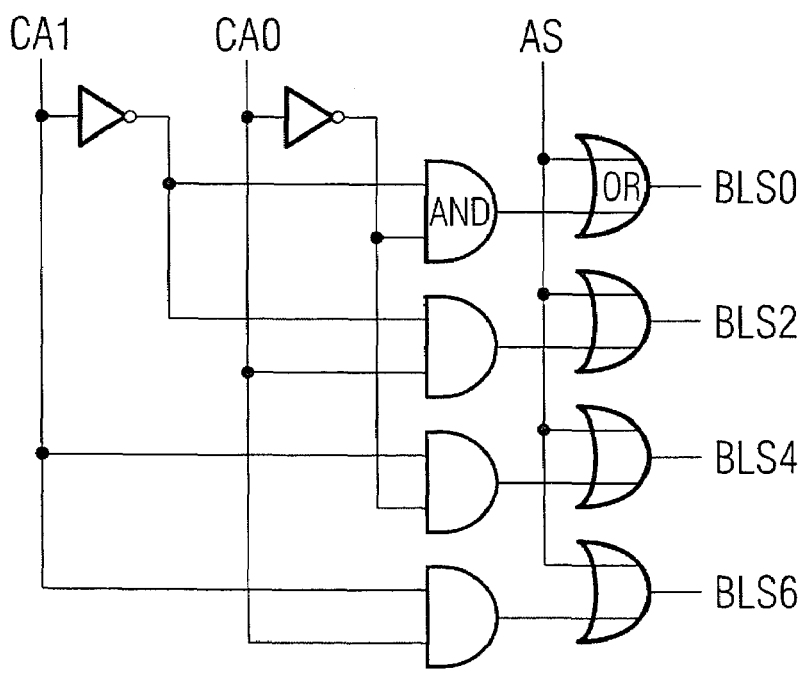
FIG. 5 shows a circuit diagram of a switching circuit according to FIG. 2 for the embodiment according to FIG. 4.

FIG. 5 shows a corresponding circuit diagram, which is similar to the diagram of FIG. 2 but further includes the OR components between the AND components and the gate electrodes of the select transistors. The OR components are switched by an additional signal AS, by which all the select transistors belonging to the same master bitline can be switched conducting at the same time.

FIG. 6 shows a diagram of the voltage levels according to the diagram of FIG. 3 for this variant that makes use of the additional signal AS. The signals CA0 and CA1 are alternatingly applied before the additional signal AS, by which the bitlines that belong to the same master bitline are short-circuited. In the example shown in FIG. 6, the high and the low programming voltages are applied alternatingly, but it is also possible to charge about one half of the bitlines to the high voltage first and then the other half to the low voltage, or vice versa. The number of bitlines that belong to each plurality of bitlines that are charged to high or low potential can vary in certain limits, but the resulting medium voltage is arranged to have a value that is a suitable inhibit voltage. Thus, no undesired programming occurs if the source/drain voltage is equal to the difference of one of the programming voltages and the intermediate inhibit voltage.

In another alternate embodiment, the circuit of FIG. 5 could be used in place of the circuit of FIG. 2, with the embodiment of FIG. 1. In this case, the additional signal AS (FIG. 5) could be activated at the same time as inhibit signal INH (FIG. 1). At this time, all bitlines (e.g., BL1, BL3, BL5 and BL7) coupled to a master bitline (e.g., MBL1) are precharged simultaneously. The preprogramming would then continue with selection of the desired memory cell and the application of program voltages VPRGH and VPRGL, as shown in the lower six lines of FIG. 3.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of programming a memory cell in a multi-bit charge-trapping memory cell array, the method comprising:
   providing an array of charge-trapping memory cells arranged in rows and columns, the array including a plurality of bitlines running in the direction of the columns, each memory cell having a first source/drain coupled to one of the bitlines and a second source/drain coupled to an adjacent one of the bitlines such that each of the source/drain regions located between two adjacent columns of the memory cells is coupled by a bitline, the bitlines being arranged in groups of bitlines, each of the groups comprising every other bitline that is arranged in succession within a section;
   applying an inhibit voltage to at least each bitline in the section that is not coupled to a memory cell that is to be programmed; and
   after applying the inhibit voltage, applying a lower programming voltage to the first source drain region of the memory cell that is to be programmed and applying an upper programming voltage to the memory cell that is to be programmed.

2. The method of claim 1, wherein applying the inhibit voltage comprises successively applying the inhibit voltage to each bitline in the section that is not coupled to the memory cell that is to be programmed.

3. The method of claim 2, wherein applying the inhibit voltage further comprises applying the inhibit voltage to the bitlines that are coupled to the memory cell that is to be programmed.

4. The method of claim 1, wherein applying the inhibit voltage comprises simultaneously applying the inhibit voltage to each bitline in the section that is not coupled to the memory cell that is to be programmed.

5. The method of claim 4, wherein applying the inhibit voltage further comprises applying the inhibit voltage to the bitlines that are coupled to the memory cell that is to be programmed.

6. The method of claim 4, wherein applying the inhibit voltage comprises:
applying the high programming voltage to some of the bitlines that are not coupled to the memory cell that is to be programmed;
applying the low programming voltage to others of the bitlines that are not coupled to the memory cell that is to be programmed; and
coupling each of the bitlines in the section to each other.

7. The method of claim 6, wherein applying the high programming voltage to some of the bitlines comprises applying the high programming voltage to every other bitline of the bitlines that are not coupled to the memory cell that is to be programmed and wherein applying the low programming voltage to others of the bitlines comprises applying the low programming voltage to the remaining bitlines of the bitlines that are not coupled to the memory cell that is to be programmed.

8. The method of claim 7, wherein applying the inhibit voltage further comprises applying the inhibit voltage to the bitlines that are coupled to the memory cell that is to be programmed.

9. The method of claim 1, wherein applying the inhibit voltage comprises applying an inhibit voltage that is about half way between the high programming voltage and the low programming voltage.

10. A method for programming multi-bit charge-trapping memory cell arrays, comprising:
providing a charge-trapping memory cell array, the array comprising:
a plurality of charge-trapping memory cells arranged in rows and columns;
each memory cell comprising a channel region between source/drain regions and a gate electrode;
each of said channel regions of the memory cells of the same column being coupled in series via said source/drain regions;
each of said gate electrodes of the memory cells of the same row being coupled by a wordline;
each of said source/drain regions located between two adjacent columns of said memory cells being coupled by a bitline;
said array being subdivided into sections, each of said sections comprising a number of neighboring bitlines;
said bitlines being arranged in groups of bitlines, each of said groups comprising every second bitline that is arranged in succession within one of said sections;
master bitlines and select transistors being arranged in such a fashion that every bitline of one of said groups is coupled to the same master bitline pertaining to said group via a respective one of said select transistors;
a switching circuit coupled to said select transistors and coupled to each bitline of one of said groups individually to the master bitline of this group; and
further select transistors arranged in such a fashion that said master bitlines are variably coupled to one of a lower programming voltage, an upper programming voltage, or an inhibit voltage;
switching said select transistors and said further select transistors so that said inhibit voltage is successively applied to a plurality of said bitlines; and
applying said lower programming voltage and said upper programming voltage to the bitlines that are connected to said source/drain regions of the memory cell that is to be programmed.

11. The method according to claim 10, wherein the inhibit voltage is also applied to the bitlines that are coupled to said source/drain regions of the memory cell that is to be programmed.

12. A method for programming multi-bit charge-trapping memory cell arrays, the method comprising:
providing a charge-trapping memory array, the array comprising:
a plurality of charge-trapping memory cells arranged in rows and columns, each memory cell comprising a channel region between source/drain regions and a gate electrode,
each of said channel regions of the memory cells of the same row being coupled in series via said source/drain regions;
each plurality of said gate electrodes of the memory cells of the same row being coupled by a wordline;
each plurality of said source/drain regions located between two adjacent columns of said memory cells being coupled by a bitline;
said array being subdivided into sections, each of said sections comprising a number of neighboring bitlines;
said bitlines being arranged in groups of bitlines, each of said groups comprising every second bitline that is arranged in succession within one of said sections;
master bitlines and select transistors arranged in such a fashion that every bitline of one of said groups is coupled to the same master bitline pertaining to said group via one of said select transistors;
a circuit switching said select transistors and coupling each bitline of one of said groups to the master bitline of this group;
a further circuit switching said select transistors and coupling said bitlines of said groups simultaneously; and
further select transistors arranged in such a fashion such that said master bitlines are variably connected to one of a lower programming voltage and an upper programming voltage;
switching said select transistors and said further select transistors so that said lower programming voltage is applied to a first plurality of said bitlines and said upper programming voltage is applied to a second plurality of said bitlines;
switching said select transistors coupled to said bitlines of said groups simultaneously, thus generating a voltage having a value between said lower programming voltage and said upper programming voltage; and
then applying said lower programming voltage and said upper programming voltage to the bitlines that are connected to said source/drain regions of the memory cell that is to be programmed.

13. The method according to claim 12, wherein each of said groups of bitlines comprises an even number of bitlines, and wherein said first plurality of said bitlines and said second plurality of said bitlines each comprises half the number of said bitlines of each of said groups.

14. The method according to claim 12, wherein said first plurality of said bitlines and said second plurality of said bitlines each comprises at least one fourth of the number of said bitlines of each of said groups.

15. The method according to claim 12,
wherein each of said groups of bitlines comprises an even number of bitlines, and
wherein switching said select transistors and said further select transistors so that said lower programming voltage is applied to a first plurality of said bitlines and said upper programming voltage is applied to a second plurality of said bitlines comprises switching said select transistors and said further select transistors so that said lower programming voltage and said upper programming voltage are applied to said bitlines of said first and second pluralities alternatingly.

16. A memory device comprising:
an array of non-volatile memory cells arranged in rows and columns, the array including a plurality of bitlines running in the direction of the columns, each memory cell having a first source/drain coupled to one of the bitlines and a second source/drain coupled to an adjacent one of the bitlines such that each of the source/drain regions located between two adjacent columns of the memory cells is coupled by a bitline, the bitlines being arranged in groups of bitlines, each of the groups comprising every other bitline that is arranged in succession within a section;
a plurality of first selection switches;
a first master bitline selectively coupled to each bitline in a first group of bitlines, each bitline being coupled to the first master bitline by a respective one of the first selection switches;
a first selection circuit coupled to the first selection switches, the first selection circuit comprising a plurality of AND gates, each AND gate coupled between at least two address signals and one of the first selection switches;
a plurality of second selection switches;
a second master bitline selectively coupled to each bitline in a second group of bitlines, each bitline being coupled to the second master bitline by a respective one of the second selection switches, wherein the bitlines in the first group comprise every other bitline in a section and the bitlines in the second group comprising the remaining bitlines in the section;
a second selection circuit coupled to the second selection switches, the second selection circuit comprising a plurality of AND gates, each AND gate coupled between at least two address signals and one of the second selection switches;
a high programming voltage node selectively coupled to the first master bitline and to the second master bitline; and
a low programming voltage node selectively coupled to the first master bitline and to the second master bitline.

17. The device of claim 16, further comprising an inhibit voltage node selectively coupled to the first master bitline and to the second master bitline.

18. The device of claim 17, further comprising means for simultaneously applying the inhibit voltage to each of the bitlines.

19. The device of claim 16, wherein the first selection circuit further comprises a plurality of OR gates coupled between the AND gates and the first selection switches and wherein the second selection circuit further comprises a plurality of OR gates coupled between the AND gates and the second selection switches.

20. The device of claim 16, wherein each of the memory cells includes a dielectric storage layer disposed between an upper confinement layer and a lower confinement layer.

* * * * *